United States Patent
El-Gamal et al.

(10) Patent No.: US 6,697,990 B2
(45) Date of Patent: Feb. 24, 2004

(54) INTERLEAVER DESIGN FOR PARSED PARALLEL CONCATENATED CODES

(75) Inventors: Hesham El-Gamal, Laurel, MD (US); A. Roger Hammons, Jr., N. Potomac, MD (US); Mustafa Eroz, Germantown, MD (US)

(73) Assignee: Hughes Electronics Corporation, El Segundo, CA (US)

( * ) Notice: Subject to any disclaimer, the term of this patent is extended or adjusted under 35 U.S.C. 154(b) by 476 days.

(21) Appl. No.: 09/734,841

(22) Filed: Dec. 13, 2000

(65) Prior Publication Data

US 2001/0034868 A1 Oct. 25, 2001

Related U.S. Application Data

(60) Provisional application No. 60/170,819, filed on Dec. 15, 1999.

(51) Int. Cl.[7] .............................................. H03M 13/00
(52) U.S. Cl. ........................................ 714/755; 714/786
(58) Field of Search ................................. 714/755, 786, 714/701, 702; 375/265

(56) References Cited

U.S. PATENT DOCUMENTS

| | | | |
|---|---|---|---|
| 5,666,370 A | 9/1997 | Gamesan et al. | ............ 714/752 |
| 5,996,104 A | 11/1999 | Herzberg | .................... 714/755 |

FOREIGN PATENT DOCUMENTS

| | | |
|---|---|---|
| EP | 0 920 164 A2 | 11/1998 |
| WO | WO 00/19618 | 6/2000 |

OTHER PUBLICATIONS

Bingeman et al., Symbol–based Turbo codes, Oct. 1999, IEEE Communications Letters, vol. 4, No. 10, p. 285–287.*
Caire et al., Parallel Concatenated codes with unequal error protection, May 1998, IEEE Transactions on communications, vol. 46, No. 5, p. 565–567.*

* cited by examiner

Primary Examiner—Albert Decady
Assistant Examiner—Shelly A Chase
(74) Attorney, Agent, or Firm—John T. Whelan; Michael Sales

(57) ABSTRACT

A method and apparatus for interleaving an input data stream for parsed parallel concatenated code encoding, the method comprising the steps of: parsing the input data stream into a plurality of parsed data substreams; and forming sets of shared information bits, wherein each of the sets of shared information bits comprises information bits in common with respective pairs of the plurality of parsed data substreams. In a variation, a further step comprises constructing constituent permutations of one or more of the sets of shared information bits. In yet a further variation, a further step comprises interlacing respective pairs of the sets of shared information bits to form respective interleaved data substreams.

16 Claims, 7 Drawing Sheets

| $t$ | $i_{A\|B}(t)$ | $i_{C\|B}(t)$ | $\lambda_{A\|B}(t)$ | $\lambda_{C\|B}(t)$ | $\pi_B(t)$ | $i_{A\|C}(t)$ | $i_{B\|C}(t)$ | $\lambda_{A\|C}(t)$ | $\lambda_{B\|C}(t)$ | $\pi_C(t)$ |
|---|---|---|---|---|---|---|---|---|---|---|
| 0 | 1 | 0 | 0 |  | 6 | 1 | 0 | 0 |  | 0 |
| 1 | 0 | 1 |  | 0 | 1 | 0 | 1 |  | 0 | 3 |
| 2 | 1 | 0 | 1 |  | 4 | 1 | 0 | 1 |  | 4 |
| 3 | 0 | 1 |  | 1 | 3 | 0 | 1 |  | 1 | 5 |
| 4 | 1 | 0 | 2 |  | 2 | 1 | 0 | 2 |  | 2 |
| 5 | 0 | 1 |  | 2 | 5 | 0 | 1 |  | 2 | 7 |
| 6 | 1 | 0 | 3 |  | 0 | 1 | 0 | 3 |  | 6 |
| 7 | 0 | 1 |  | 3 | 7 | 0 | 1 |  | 3 | 1 |

FIG. 8

| $t$ | $\sigma$ | $\sigma_A$ | $\sigma_B$ | $\sigma_C$ | $\sigma_{AB}$ | $\sigma_{AC}$ | $\sigma_{BC}$ |
|---|---|---|---|---|---|---|---|
| 0 | 0 | 0 | 2 | 0 | 1 | 0 | 2 |
| 1 | 4 | 3 | 5 | 5 | 0 | 3 | 1 |
| 2 | 8 | 6 | 0 | 6 | 3 | 2 | 0 |
| 3 | 9 | 1 | 3 | 3 | 2 | 1 | 3 |
| 4 | 1 | 4 | 6 | 4 |  |  |  |
| 5 | 5 | 7 | 1 | 1 |  |  |  |
| 6 | 6 | 2 | 4 | 2 |  |  |  |
| 7 | 10 | 5 | 7 | 7 |  |  |  |
| 8 | 2 |  |  |  |  |  |  |
| 9 | 3 |  |  |  |  |  |  |
| 10 | 7 |  |  |  |  |  |  |
| 11 | 11 |  |  |  |  |  |  |

FIG. 9

| $t$ | $\pi_A(t)=\sigma_A(t)$ | $i_{A\|B}(t)$ | $i_{C\|B}(t)$ | $\lambda_{A\|B}(t)$ | $\lambda_{C\|B}(t)$ | $\pi_B(t)$ | $i_{A\|C}(t)$ | $i_{B\|C}(t)$ | $\lambda_{A\|C}(t)$ | $\lambda_{B\|C}(t)$ | $\pi_C(t)$ |
|---|---|---|---|---|---|---|---|---|---|---|---|
| 0 | 0 | 1 | 0 | 0 |  | 4 | 1 | 0 | 0 |  | 0 |
| 1 | 3 | 0 | 1 |  | 0 | 5 | 0 | 1 |  | 0 | 3 |
| 2 | 6 | 1 | 0 | 1 |  | 6 | 1 | 0 | 1 |  | 4 |
| 3 | 1 | 0 | 1 |  | 1 | 3 | 0 | 1 |  | 1 | 1 |
| 4 | 4 | 1 | 0 | 2 |  | 0 | 1 | 0 | 2 |  | 6 |
| 5 | 7 | 0 | 1 |  | 2 | 1 | 0 | 1 |  | 2 | 7 |
| 6 | 2 | 1 | 0 | 3 |  | 2 | 1 | 0 | 3 |  | 2 |
| 7 | 5 | 0 | 1 |  | 3 | 7 | 0 | 1 |  | 3 | 5 |

INTERLEAVER DESIGN FOR PARSED PARALLEL CONCATENATED CODES

This application claims priority under 35 U.S.C. § 119(e) to U.S. Provisional Patent Application Ser. No. 60/170,819, filed Dec. 15, 1999, of El Gamal, et al., for INTERLEAVER DESIGN FOR PARSED PARALLEL CONCATENATED CODES, which U.S. Provisional Patent Application is incorporated herein by reference.

BACKGROUND OF THE INVENTION

The present invention relates to data stream encoders, and more specifically to data stream encoders using parsed parallel concatenated codes. Even more specifically, the present invention relates to a pseudo random interleaver design within a data stream encoder using parsed parallel concatenated codes that accounts for the parsing function of the encoder resulting in improved asymptotic performance.

Third generation code division multiple access (CDMA) communications systems typically employ forward error correction (FEC) schemes using, for example, Turbo codes. As such, prior to being transmitted over a communications channel, for example, a data stream is often encoded such that the content of the data is not recoverable to those intercepting the transmitted data stream. Typically, such data streams may be encoded using a Turbo encoder, which consists of a parallel concatenation of two constituent encoders in which the input data stream x(k) is encoded by both encoders to produce parity bits $y_1(k)$ and $y_2(k)$. The first and second constituent encoders each see the input data stream as presented in a different order due to an embedded Turbo interleaver. Each constituent encoder encodes its interleaver. Each constituent encoder encodes its respective data bits to provide output coded bits x(k), $y_1(k)$, $y_2(k)$. These output coded bits are typically punctured to produce a desired code rate. For example, the natural rate of a conventional Turbo encoder is ⅓; however, the coded output is punctured to produce an output code rate of ½. At the receiver a respective Turbo decoder is required to decode the coded data stream. The operation and functionality of conventional Turbo codes, Turbo encoders and decoders is well known in the art.

More recently, encoders using parsed parallel concatenated codes are being implemented. A parsed parallel concatenated code (also referred to as P2CCC) is a code construction that is similar to the conventional turbo code structure, but with a parser to distribute subsets of information bits from the input data stream to various parallel constituent encoders. The parsing strategy breaks up the input sequences producing low Hamming weight error events, thereby improving the weight spectrum and asymptotic performance of the code, while not impacting the sharp "waterfall region" performance of the corresponding turbo code. Thus, the parsing function serves a similar function as the embedded turbo interleaver. The parsed streams are then separately interleaved and separately encoded by respective constituent encoders. The output of the constituent encoders is then punctured in a prescribed puncturing pattern to produce the overall code rate. In a typical design, the parser ideally ensures that every information bit in the input data stream is seen by at least two of the constituent encoders in order that soft-decision decoding will be able to efficiently refine the likelihood decision statistic for each information bit based on the outputs from multiple constituent decoders.

While it is known how to design interleavers reasonably well for conventional turbo codes, the parsing function makes the design of interleavers for P2CCC encoders a non-trivial problem. Using random interleavers, the P2CCC encoder has a performance advantage over the conventional turbo codes in the asymptotic region. However, when s-random interleavers (i.e. a pseudo random permutation that avoids mapping positions within a window of width S to new positions that are also within a window of width S, thus guaranteeing a minimum separation between positions) are used, the performance advantage of P2CCC is eliminated over conventional turbo codes. This is due to the fact that conventional s-random interleavers do not take into account the parsing function common to P2CCC encoders.

SUMMARY OF THE INVENTION

The present invention advantageously addresses the needs above as well as other needs by providing an interleaver design for a parsed parallel concatenated coder implementing coordinated s-random interleavers and accounting for the parsing function.

In one embodiment, the invention can be characterized as a method of interleaving an input data stream for parsed parallel concatenated code encoding comprising the steps of: parsing the input data stream into a plurality of parsed data substreams; and forming sets of shared information bits, wherein each of the sets of shared information bits comprises information bits in common with respective pairs of the plurality of parsed data substreams. In a variation of this embodiment, a further step comprises constructing constituent permutations of one or more of the sets of shared information bits. In yet a further variation of this embodiment, a further step comprises interlacing respective pairs of the sets of shared information bits to form respective interleaved data substreams.

In another embodiment, the invention can be characterized as an interleaver design for a parsed parallel concatenated code encoder including a parser for parsing an input data stream into a plurality of parsed data substreams. Also included is a plurality of interleavers coupled to the parser such that each of the plurality of interleavers constructs constituent permutations of respective ones of sets of shared information bits. Each of the sets of shared information bits comprises information bits in common to respective pairs of the plurality of parsed data substreams.

BRIEF DESCRIPTION OF THE DRAWINGS

The above and other aspects, features and advantages of the present invention will be more apparent from the following more particular description thereof, presented in conjunction with the following drawings wherein:

FIG. 8 is a table of the computational P2CCC interleavers to be input into the respective constituent encoders of the parsed parallel concatenated code (P2CCC) encoder of FIGS. 5 and 6 in accordance with Example I;

FIG. 9 is a table of parsed data substreams (i.e. $\sigma_A$, $\sigma_B$ and $\sigma_C$) and respective sets of shared information bits (i.e. $\sigma_{AB}$, $\sigma_{BC}$ and $\sigma_{AC}$) as generated from the coordinated interleaver design of FIGS. 5 and 6 in accordance with Example II; and FIG. 10 is a table of the computational parsed parallel concatenated code (P2CCC) interleavers to be input into the respective constituent encoders of the P2CCC encoder of FIGS. 5 and 6 in accordance with Example Corresponding reference characters indicate corresponding components throughout the several views of the drawings.

DETAILED DESCRIPTION OF THE PREFERRED EMBODIMENTS

The following description of the presently contemplated best mode of practicing the invention is not to be taken in a limiting sense, but is made merely for the purpose of describing the general principles of the invention. The scope of the invention should be determined with reference to the claims.

Figure 1:
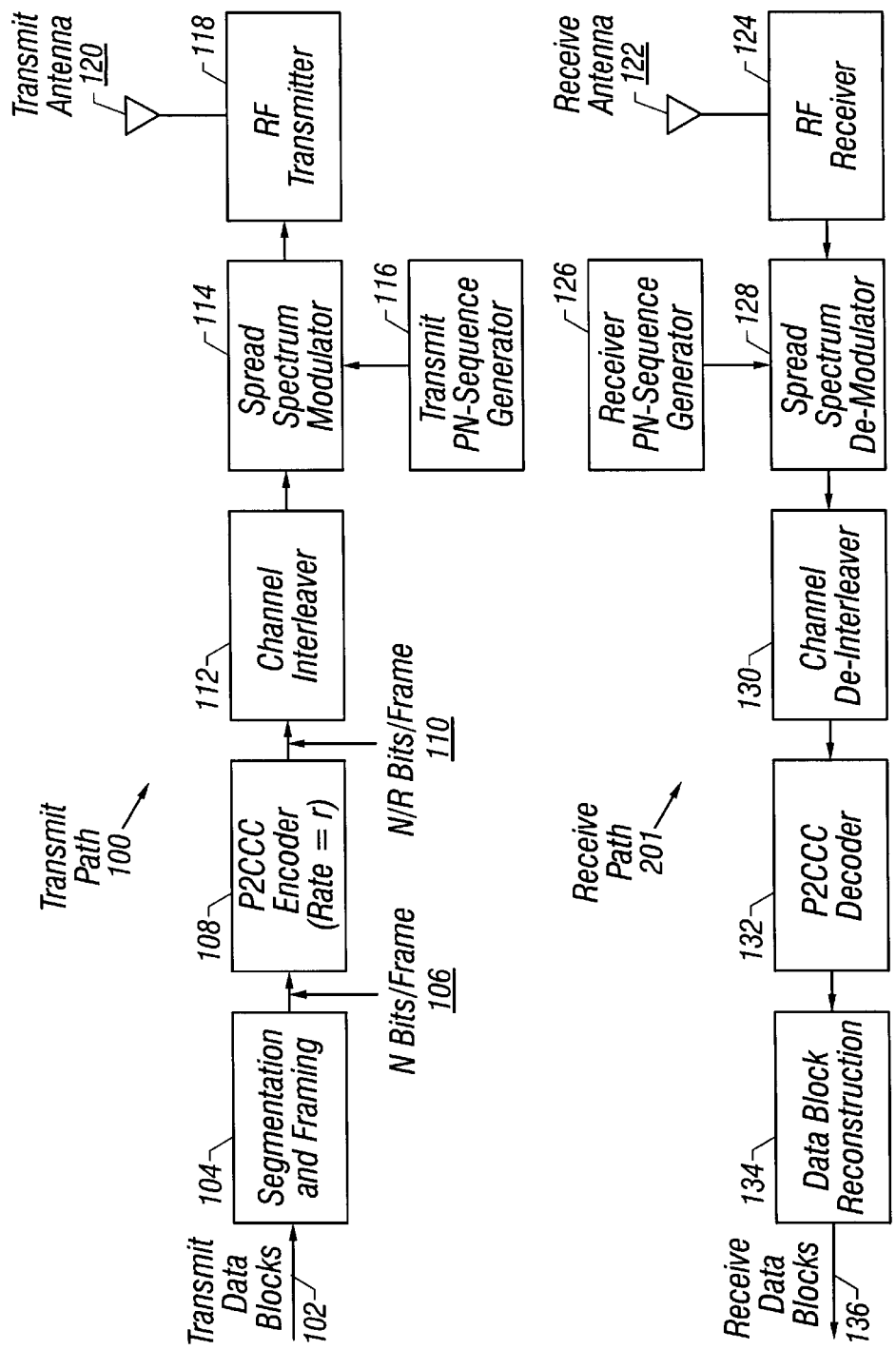
FIG. 1 is a block diagram of a system for a digital cellular mobile radio system which implements parsed parallel concatenated code (P2CCC) encoding.

Referring first to FIG. 1, a block diagram of a system for a digital cellular mobile radio system is shown which implements parsed parallel concatenated code (P2CCC) encoding. The digital cellular system includes a transmit path 100 including a segmentation processor 104, a parsed parallel concatenated code (P2CCC) encoder 108, a channel interleaver 112, a spread spectrum modulator 114, a transmit PN-sequence generator 116, an RF transmitter 118 and a transmit antenna 120. The receive path 201 includes a receive antenna 122, RF receiver 124, spread spectrum demodulator 128, a receiver PN-sequence generator 126, a channel de-interleaver 130, a parsed parallel concatenated code (P2CCC) decoder 132, and a data block reconstruction processor 134. Also shown are transmit data blocks 102 and receive data blocks 136.

This illustration represents generally the forward or the reverse links in a digital cellular mobile radio system. For example, the forward link is illustrated if the transmit path 100 is in the base station and the receive path 101 is in the mobile station of the system. Likewise, the reverse link is illustrated if the transmit path 100 is in the mobile station and the receive path 101 is in the base station. The digital cellular mobile radio system is typically within a third generation code division multiple access (CDMA) communications system. Further, while the CDMA system is used as an example, P2CCC encoding is also applicable to other communications systems, such as time division multiple access (TDMA).

In the transmit path 100, the system comprises a segmentation processor 104 where transmit data blocks 102 from a data terminal equipment (not shown) are segmented and framed at a segmentation processor 104 into fixed length frames of N bits per frame 106 which are input (as an input data stream) to a parsed parallel concatenated code (P2CCC) encoder 108 of rate r that is coupled to the segmentation processor 104. The output from the P2CCC encoder 108, which is an output encoded data stream of N/r code symbols 110, is input to a channel interleaver 112 to pseudo-randomize the code symbols. The channel interleaver 112 provides output to a spread spectrum modulator 114 which uses a user specific PN-code from a PN-sequence generator 116 to create a spread spectrum signal, carried on a RF carrier to an RF transmitter 118. The channel interleaver 112 is distinguished from an interleaver (not shown) internal to the P2CCC encoder 108 which will be described further below with reference to FIGS. 2–10. The RF transmitter 118 coupled to the transmit antenna 120 uses a high power amplifier (not shown) at the transmit antenna 120 to radiate the signal to the receive antenna 122. The techniques of spread spectrum modulation and RF transmission are well known art to one familiar with spread spectrum communication systems.

In the receive path 201, the signal from the transmit antenna 118 is received at the receive antenna 122 (either in the base station or the mobile station) is amplified in the RF receiver 124 and demodulated in the spread spectrum demodulator 128, which uses the same PN-code as used by the RF transmitter 118, to de-spread the signal. The demodulated symbols are de-interleaved by the channel De-interleaver 130, and input to the P2CCC decoder 132. Decoded information bits from P2CCC decoder 132 are reconstructed at a reconstruction processor 134 into receive data blocks 136 and forwarded to the data terminal equipment at the receive end.

Figure 2:
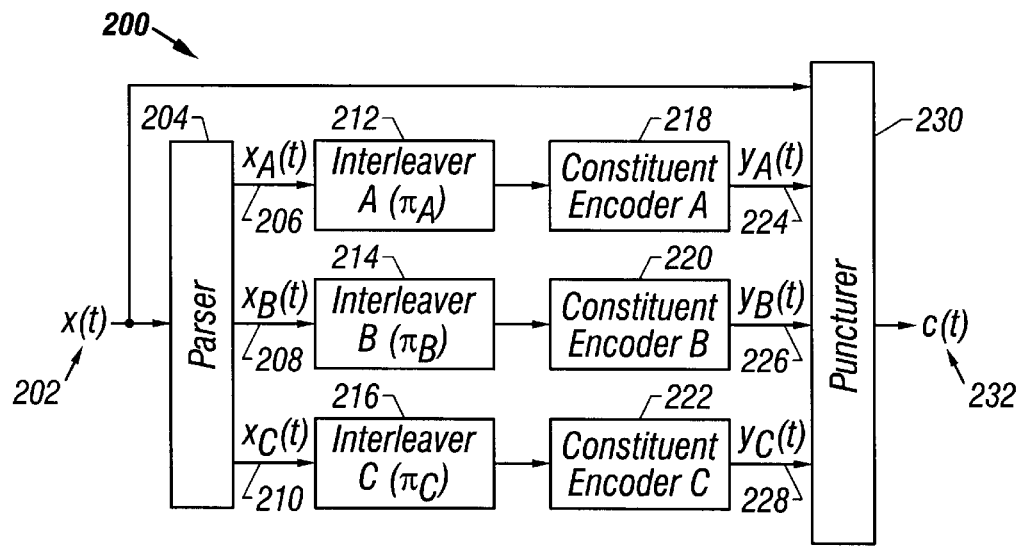
FIG. 2 is a functional block diagram of a conventional parsed parallel concatenated code (P2CCC) encoder, for use in the system of FIG. 1, for example.

Referring next to FIG. 2, a functional block diagram is shown of a conventional parsed parallel concatenated code (P2CCC) encoder, such as may be implemented in the system of FIG. 1. Illustrated is a P2CCC encoder 200 including an input data stream 202 (x(t)), a parser 204, parsed data substreams 206, 208 and 210 ($x_A(t)$, $x_B(t)$, and $x_C(t)$), interleavers 212, 214 and 216 ($\pi_A$, $\pi_B$, and $\pi_C$), constituent encoders 218, 220 and 222, parity bit streams 224, 226 and 228 ($y_A(t)$, $y_B(t)$, and $y_C(t)$, which are also referred to as coded bit streams), a puncturer 230, and an encoded output data stream 232 (c(t)).

The input data stream 202 is input to a parser 204 and also to the puncturer 230. The outputs (i.e. parsed data substreams 206, 208 and 210) of the parser 204 are coupled to respective ones of the interleavers 212, 214 and 216. Each of the constituent encoders 218, 220 and 222 is coupled to a respective one of the interleavers 212, 214 and 216. The output of each constituent encoder 218, 220 and 222 (i.e. parity bit streams 224, 226 and 228) is coupled to the puncturer 230, which outputs the encoded output data stream 232.

P2CCC codes are relatively new Turbo-like code constructions, but with a parser 204 to distribute subsets of information bits (e.g. parsed data substreams 206, 208 and 210) from the input data stream 202 to various parallel interleavers 212, 214, and 216 and constituent encoders 218, 220 and 222. Typically, the parser 204 parses the input data stream 202 such that each information bit x(t) within the input data stream 202 is sent to two of the three interleavers and, thus, two of the three constituent encoders. For example, constituent encoder 218 sees parsed data substream $x_A(t)$ 206 containing every information bit $x(t)$ for which t=0 or 1 modulo 3; constituent encoder 220 sees parsed data substream $x_B(t)$ 208 containing every information bit $x(t)$ for which t=0 or 2 modulo 3; and constituent encoder 222 sees parsed data stream $x_C(t)$ 210 containing every information bit $x(t)$ for which t=1 or 2 modulo 3. This allows for the iterative soft-decision decoding at the decoder receiving the encoded output data stream 232 to be able to efficiently refine the likelihood decision statistic for each information bit based upon outputs from multiple semi-independent constituent decoders.

The parsing strategy breaks up the input data sequences producing low Hamming weight error events, thereby improving the weight spectrum and asymptotic performance of the code, while not impacting the sharp "waterfall region" performance of the corresponding Turbo code. Thus, the parsing function serves a similar function as an embedded Turbo interleaver.

The parsed data substreams 206, 208 and 210 are then separately interleaved by interleavers 212, 214 and 216. The interleaving alters the order of presentation of the information bits within the respective parsed data substream as presented to the respective constituent encoders. This is also referred to as a "permutation" of the information bits within the parsed data substreams. The interleaving applied to the separate parsed data substreams should ideally be independent of one another in order to produce a high degree of randomness among the parity bit streams 224, 226 and 228. For example, one of the interleavers, e.g. interleaver 212, is the identity permutation, which means that the parsed data substream 206 is not actually interleaved (i.e. the order of presentation remains the same to the constituent encoder 218), while interleavers 214 and 216 are random interleavers.

After being interleaved at each of the interleavers 212, 214 and 216, each parsed data substream 206, 208 and 210 is encoded by a respective one of the constituent encoders 218, 220 and 222. As with Turbo encoders, these constituent encoders 218, 220, and 222 may be the same or different. The parity bit streams 224, 226 and 228 (also referred to as coded bits streams) output from each of the constituent encoders are then punctured with the input data stream 202 in a prescribed puncturing pattern to produce the overall code rate r. The puncturer 230 outputs the encoded output data stream 232, which may then be modulated and transmitted over a communications channel to a receiver containing an appropriate decoder, e.g. see the system of FIG. 1. The design and implementation of such a P2CCC encoder 200 is well known in the art. The design and implementation of a corresponding P2CCC decoder is based upon the same principles as the conventional turbo decoder which is well known in the art.

In operation, if there are N information bits within the input data stream 202, then each constituent encoder 218, 220 and 224 produces 2N/3 output parity bits within the parity bit streams 224, 226 and 228. The overall code rate is therefore, $R=N/[N+3(2N/3)]=1/3$, which is the same as a conventional turbo code. As is known, this rate may be altered by the skilled artist.

Figure 3:
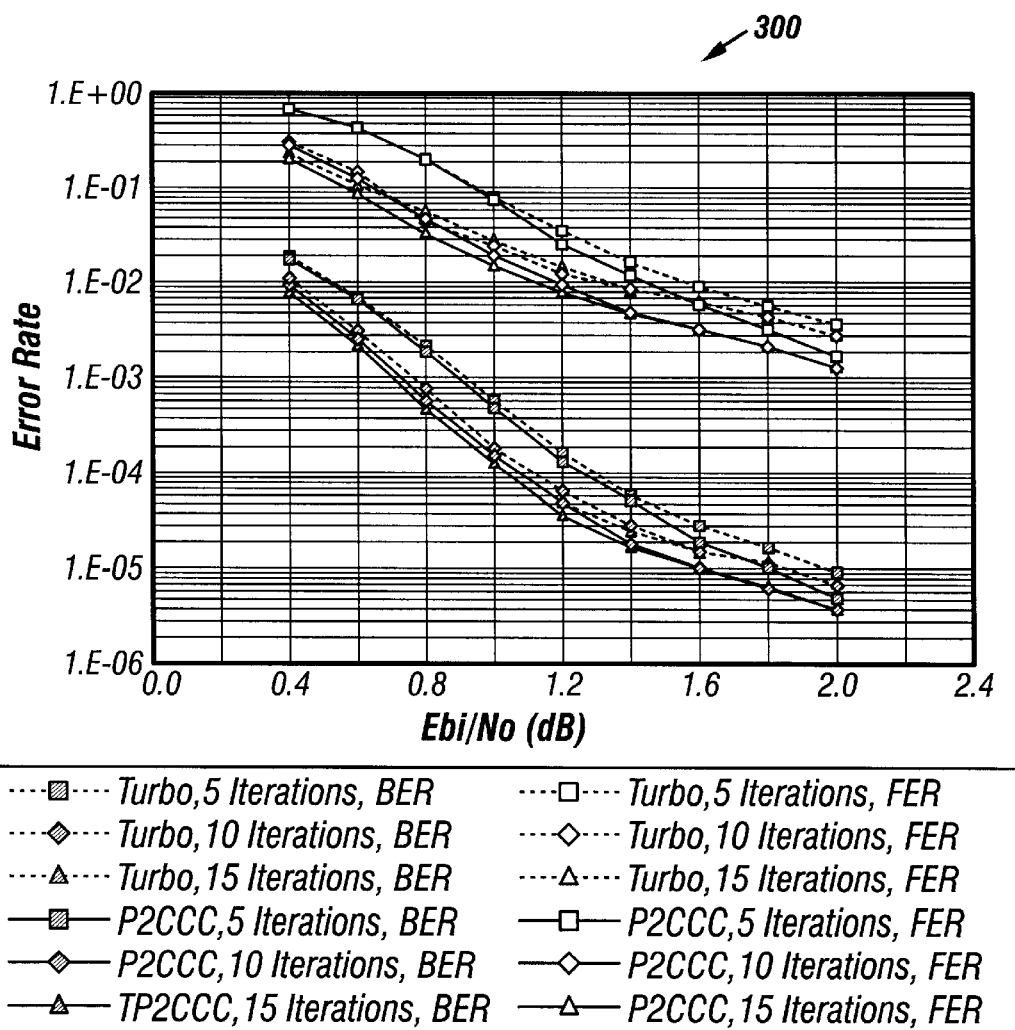
FIG. 3 is a graphical representation of the performance of the encoder of FIG. 2 versus a corresponding turbo code, both of which use 4-state constituent encoders and random interleavers, illustrating a performance advantage of the P2CCC code over the conventional turbo code.

Referring next to FIG. 3, a graphical representation is shown of the performance of the P2CCC encoder 200 of FIG. 2 versus a corresponding turbo encoder, both of which use 4-state constituent encoders and random interleavers, illustrating a performance advantage of the P2CCC code over the conventional turbo code. While it is known how to design interleavers reasonably well for conventional Turbo codes, the parsing function of the parser 104 makes the design of interleavers for P2CCC encoders a non-trivial problem. The graphical representation 300 compares encoders including interleavers 212, 214 and 216 that are random interleavers and constituent encoders 218, 220 and 222 that are 4-state encoders. As illustrated, with random interleavers, the P2CCC encoder 200 yields better performance in the asymptotic region than a Turbo encoder. However, it is known that careful interleaver design for turbo codes increases the free distance of the code and thereby improves asymptotic performance over purely random interleaves, while not degrading performance in the waterfall region (i.e., performance at a low signal to noise ratio).

Figure 4:
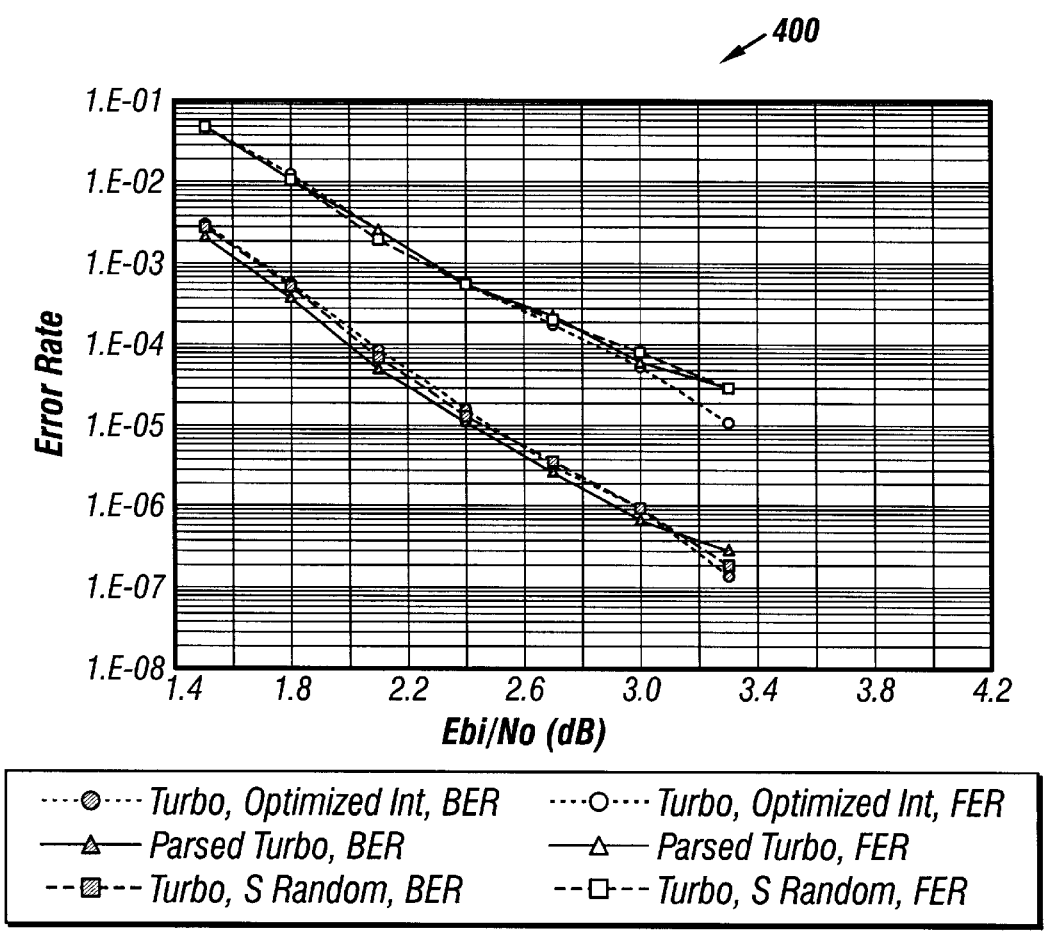
FIG. 4 is a graphical representation of the performance of the encoder of FIG. 2 versus a corresponding turbo code, both of which use 4-state constituent encoders and s-random interleavers, illustrating the loss of the advantage of the P2CCC code and the conventional turbo code.

Referring next to FIG. 4, a graphical representation 400 of the performance of the P2CCC encoder 200 of FIG. 2 versus a corresponding turbo code, both of which use 4-state constituent encoders and s-random interleavers, illustrating the loss of the advantage of the P2CCC code and the conventional turbo code when using pseudo random interleavers. However, in comparison to FIG. 3, when s-random interleavers (i.e. a pseudo random permutation as known in the art that avoids mapping positions within a window of width S to new positions that are also within a window of width S; thus, guaranteeing a minimum separation between positions) are used, the performance advantage of P2CCC encoder 200 over a conventional Turbo encoder is eliminated.

The explanation for this puzzling behavior is key to a proper interleaver design for the P2CCC construction, for example, in the P2CCC encoder 200 of FIG. 2. In both the conventional turbo encoder and the P2CCC encoder 200, S-random interleavers ensure good dispersion with respect to the initial input order of the input data stream 202 (i.e., with respect to the order of presentation to constituent encoder 218). This produces excellent performance for conventional turbo codes but is insufficient for P2CCC constructions.

For example, given that interleaver A 212 is an identity permutation, and interleaver B 214 and interleaver B 216 are independent S-random interleavers, the information bits that constituent encoder A 218 and constituent encoder B 220 have in common are referred to as the AB bits. That is, the AB bits are the bits in common between the parsed data substreams 206 and 208. Likewise, let the AC bits and BC bits denote the information bits that the indicated constituent encoders have in common, i.e. the AC bits are the information bits in common between parsed data substreams 206 and 210 and the BC bits are the information bits in common between parsed data substreams 208 and 210. The presentation order of the AB bits to constituent encoder B 220 is interleaved with respect to the presentation order of the AB bits to constituent encoder A 218 in such a way that the S-random interleaver B 214 provides good dispersion [between the AB bits as presented to constituent encoders A and B]. Similarly, the different orderings of the AC bits that constituent encoders A 218 and C 222 have in common will also exhibit good dispersion with respect to one another due to the identity interleaver A and the S-random interleaver C 216.

However, the S-random interleavers associated with constituent encoders B 220 and C 222 are independent of each other, so that the ordering of the BC bits as presented to constituent encoder C 222 is essentially random compared to the ordering of the BC bits as presented to constituent encoder B 220. In other words, the favorable dispersion property of the BC bits as presented to encoders B and C is not preserved, which leads to poorer performance in the asymptotic region that is more typical of purely random interleavers. This is due to the fact that conventional s-random interleavers do not take into account the parsing function of the P2CCC encoder 200.

Figure 5:
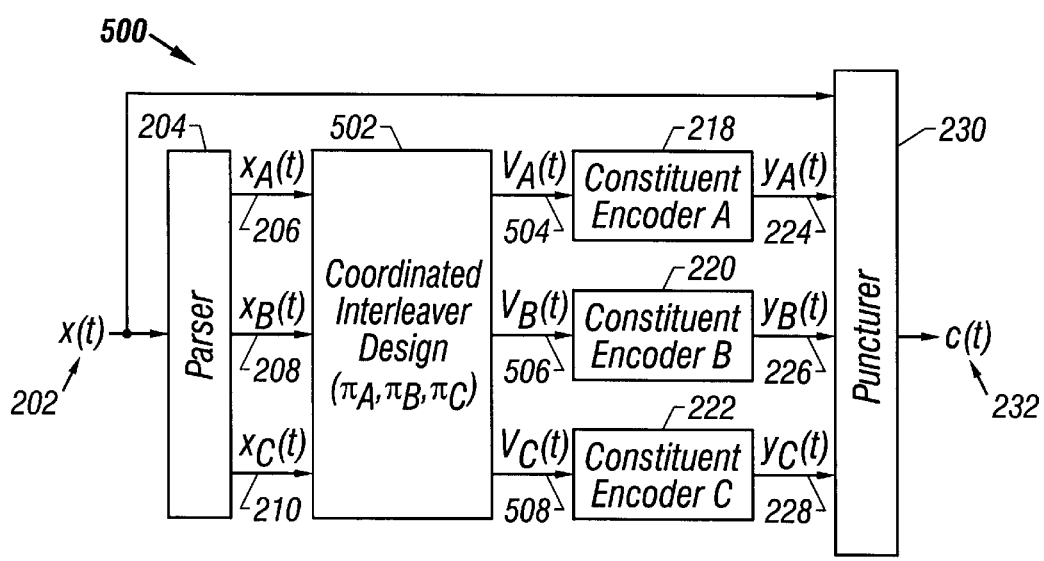
FIG. 5 is a functional block diagram of a parsed parallel concatenated code (P2CCC) encoder for use in the system of FIG. 1 for example, in accordance with one embodiment of the present invention.

Referring next to FIG. 5, a functional block diagram is shown of a parsed parallel concatenated code (P2CCC) encoder in accordance with one embodiment of the present invention. Shown is a P2CCC encoder 500 including the input data stream 202 (x(t)), the parser 204, parsed data substreams 206, 208 and 210 ($x_A(t)$, $x_B(t)$, and $x_C(t)$), coordinated interleaver design 502 ($\pi_A$, $\pi_B$, and $\pi_C$), constituent encoders 218, 220 and 222, interleaved data substreams 504, 506 and 508 ($v_A(t)$, $v_B(t)$ and $v_C(t)$), parity bit streams 224, 226 and 228 ($y_A(t)$, $y_B(t)$, and $y_C(t)$ or also referred to as coded bit streams), a puncturer 230, and an encoded output data stream 232 (c(t)).

The P2CCC encoder 500 of this embodiment operates similarly to the P2CCC encoder 200 of FIG. 2, although the interleaver is designed for use with s-random interleavers operating in a coordinated fashion to account from the parsing function. As such, this embodiment of the invention solves the problem noted with reference to FIG. 4 by co-designing the various constituent interleavers in a way that is consistent with the parsing strategy. Thus, advantageously, the coordinated interleaver design 502 ensures a favorable dispersion between the information bits in common between all of the pairs of constituent encoders 218, 220 and 222, including the BC bits as presented to constituent encoders 220 and 222, such that the P2CCC encoder 500 will again have a performance advantage over a conventional Turbo encoder operating with s-random encoders. The details of the interleaver design are described with reference to FIGS. 6–10 below. Again, as with the P2CCC encoder 200 of FIG. 2, the functionality of the P2CCC encoder 500 of FIG. 5 is performed by a processor, typically a digital signal processor.

Figure 6:
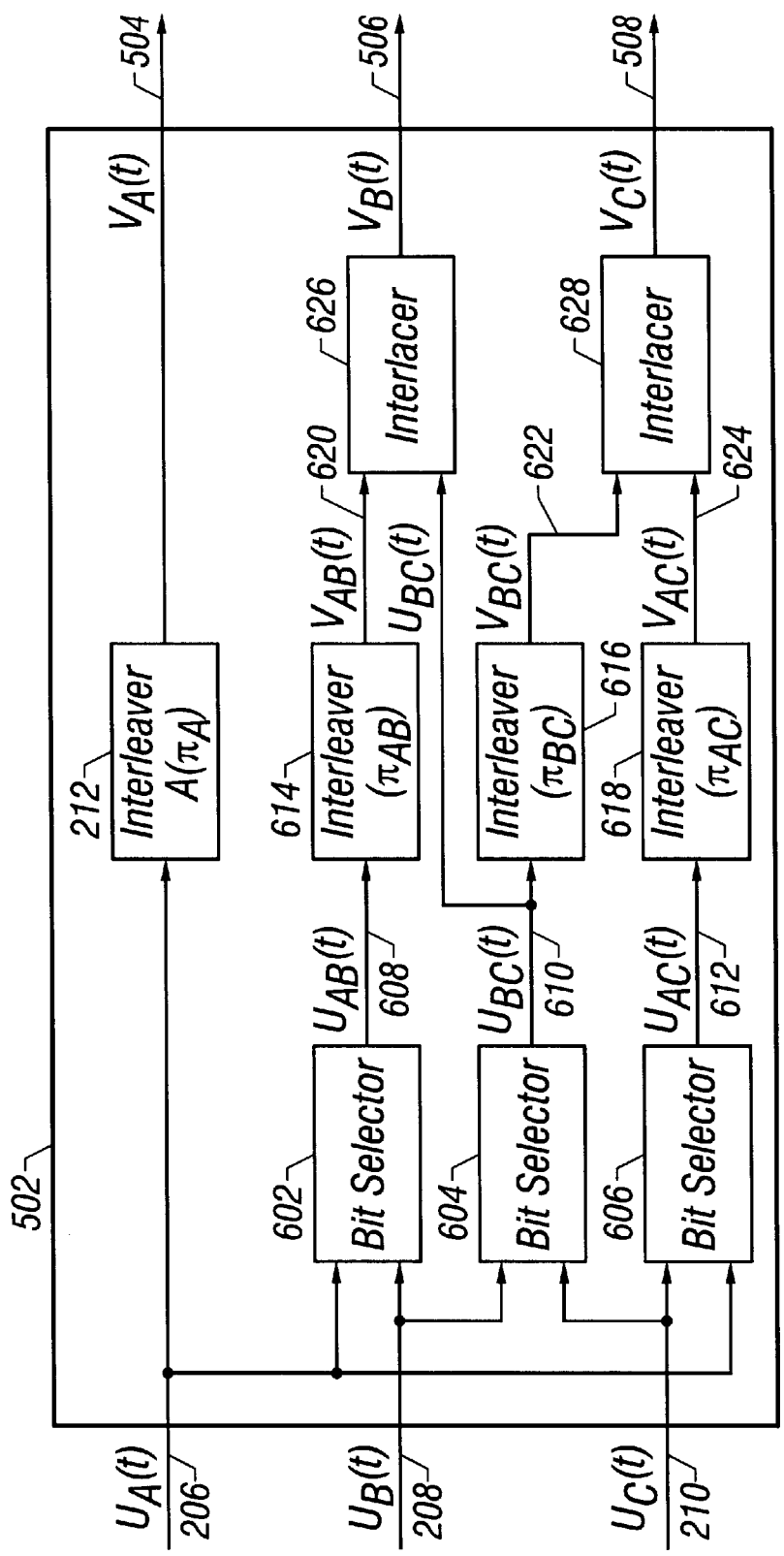
FIG. 6 is a functional block diagram of a coordinated interleaver design of the P2CCC encoder of FIG. 5 employing s-random interleavers, in accordance with an embodiment of the invention.

Referring next to FIG. 6, a functional block diagram is shown of a coordinated interleaver design of the P2CCC encoder of FIG. 5 employing s-random interleavers. The coordinated interleaver design 502 includes parsed data substreams 206, 208 and 210 ($u_A(t)$, $u_B(t)$, and $u_C(t)$, respectively), bit selectors 602, 604 and 606 (also referred to as shared bit selectors and generically as selectors), sets of shared information bits 608, 610 and 612 ($u_{AB}(t)$, $u_{BC}(t)$ and $u_{AC}(t)$, respectively), interleaver A 212 ($\pi_A$), interleavers 614, 616 and 618 ($\pi_{AB}$, $\pi_{BC}$, and $\pi_{AC}$), sets of interleaved shared information bits 620, 622 and 624 ($v_{AB}(t)$, $v_{BC}(t)$ and $v_{AC}(t)$, respectively), interlacers 626 and 628, and interleaved data substreams 504, 506, and 508 ($v_A(t)$, $v_B(t)$ and $v_C(t)$, respectively). Note with reference to FIG. 6, the parsed data substreams $x_A(t)$, $x_B(t)$, and $x_C(t)$ are now referred to as parsed data substreams $u_A(t)$, $u_B(t)$, and $u_C(t)$, respectively, such that the label $u_X(t)$ stands for the Xth "uninterleaved" data bit at time t.

In operation, the coordinated interleaver design 502 co-designs the interleavers ($\pi_A$, $\pi_B$, and $\pi_C$) in order to account for the parsing strategy. In this embodiment, interleaver 212 is the identity permutation and interleavers 614, 616 and 618 are s-random interleavers as known in the art.

In order to illustrate this embodiment, vectors $\underline{u}_{(\ )}$ and $\underline{v}_{(\ )}$ denote, respectively, uninterleaved and interleaved sets of information bits, with the subscript denoting the set of constituent encoders processing those information bits, e.g. constituent encoders 218, 220 and 222. For example, in this nomenclature, the vector $\underline{u}=[u(0),u(1),\ldots,u(3n-1)]$ will donate the set of all unparsed information bits (i.e. input data stream x(t) 202), the vector $\underline{u}_A=[u_A(0), u_A(1),\ldots,u_A(2n-1)]$ will donate the set of all information bits parsed to constituent encoder A (i.e. parsed data substream $u_A(t)$), and the vector $\underline{u}_{AB}=[u_{AB}(1),\ldots,u_{AB}(1),\ldots,u_{AB}(n-1)]$ will donate the set of AB bits (i.e. set of shared information bits $u_{AB}(t)$). The permutation producing $\underline{v}_x$ from $\underline{u}_x$ will be donated $\pi_x$ with the rule that $v_x(t)=u_x(\pi_x(t))$.

Additionally, two auxiliary functions $i_{(\ )}$ and $\lambda_{(\ )}$ with similar subscripting conventions will also be useful in describing interleaver actions. Loosely speaking, the function $i_{X|Y}$ is the indicator function for X acting on Y, and $\lambda_{X|Y}$ is its cumulant. For example, $i_{C|B}$ is defined over the domain in indices $0 \leq t < 2n$ associated with the sequence $\underline{u}_B$. It assumes value $i_{C|B}(t)=1$ if $u_B(t)$ is a BC bit and value $i_{C|B}(t)=0$ otherwise. Furthermore, if $u_B(t)$ is a BC bit, then the cumulant $$\underline{v}_A = [u^{(\sigma)}(0), u^{(\sigma)}(1), u^{(\sigma)}(2), u^{(\sigma)}, (3), u^{(\sigma)}(4), u^{(\sigma)}(5), u^{(\sigma)}(6), u^{(\sigma)}(7)]$$
$$= [u(0), u(4), u(9), u(1), u(6), u(10), u(3), u(7)]$$

$$\underline{v}_B = [u^{(\sigma)}(10), u^{(\sigma)}(2), u^{(\sigma)}(7), u^{(\sigma)}, (5), u^{(\sigma)}(4), u^{(\sigma)}(8), u^{(\sigma)}(1), u^{(\sigma)}(11)]$$
$$= [u(7), u(8), u(10), u(5), u(1), u(2), u(4), u(11)]$$

$$\underline{v}_C = [u^{(\sigma)}(0), u^{(\sigma)}(5), u^{(\sigma)}(6), u^{(\sigma)}, (8), u^{(\sigma)}(3), u^{(\sigma)}(11), u^{(\sigma)}(9), u^{(\sigma)}(2)]$$
$$= [u(0), u(5), u(6), u(2), u(9), u(11), u(3), u(8)]$$

gives its position in the sequence $\underline{u}_{BC}$.

Figure 7:
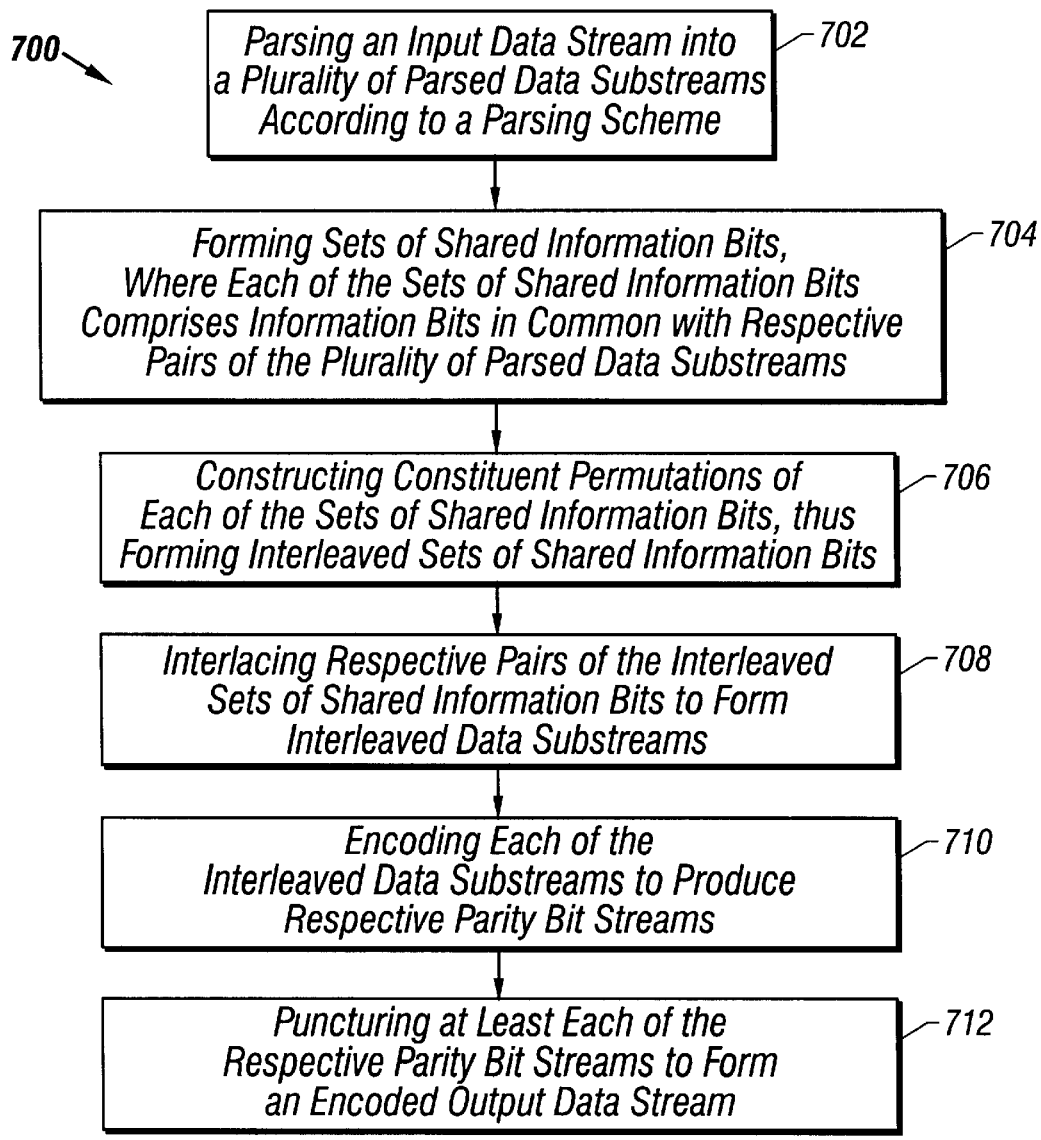
FIG. 7 is a flow chart of the steps performed by the parsed parallel concatenated code (P2CCC) encoder of FIGS. 5 and 6, for example, using the coordinated interleaver design of FIG. 6 in accordance with another embodiment of the present invention.

The first step in the P2CCC encoding is to parse the input data stream 202 in to a plurality of parsed data substreams 206, 208 and 210 according to a parsing scheme (Step 702 of FIG. 7). For example, the input data stream 202 is parsed into three parsed data substreams 206, 208 and 210. Furthermore, the parsing is done according to any number of parsing schemes, such as a scheme in which each information bit of the input data stream 202 is seen at two of the three constituent encoders 218, 220 and 222.

Next, sets of shared information bits 608, 610 and 612 are formed between respective pairs of the parsed data substreams 206, 208 and 210, wherein each of the sets of shared information bits 608, 610 and 612 includes the information bits in common between the respective pairs of parsed data substreams 206, 208 and 210 (Step 704 of FIG. 7). Thus, as shown, given parsed data substreams A, B, and C (i.e. $\underline{u}_A$, $\underline{u}_B$ and $\underline{u}_C$), a set of AB bits are formed (i.e. $\underline{u}_{AB}$), a set of BC bits are formed (i.e. $\underline{u}_{BC}$), and a set of AC bits (i.e. $\underline{u}_{AC}$) are formed, wherein the AB bits include the information bits in common between parsed data substream A and parsed data substream B, and so on. This step is accomplished, for example, by dividing each of the parsed data substreams 206, 208 and 210 into two identical parsed data substreams and comparing respective copies of parsed data substreams at a bit selector (i.e. bit selectors 602, 604 and 606), which selects and outputs a set of bits in common to both parsed data substreams. For example, at bit selector 602, parsed data substream A and B are compared and the set of AB bits, i.e. $u_{AB}(t)$ is selected and output. Similarly, $u_{BC}(t)$ and $u_{AC}(t)$ are formed respectively at bit selectors 604 and 606. The functionality of the bit selectors 602, 604 and 606 is performed in software by the P2CCC encoder 500 and is well within the abilities of the skilled artist.

Forming sets of shared information bits in common between respective pairs of the parsed data substreams represents a departure from conventional P2CCC encoders that simply interleave each parsed data substream without altering or performing any additional steps prior to the interleaving.

Since parsed data substreams 208 and 210 are to be interleaved such that there is a spatial dispersion between the BC bits, the identity permutation is performed to the parsed data substream 206, such that parsed data substream 206 will be input in its natural order to the constituent encoder 218, as is done in the conventional P2CCC encoder 200. Thus, parsed data substream 206 is input into interleaver 212, which is an identity permutation, and interleaved data substream 504 (i.e. $v_A(t)$) is output to constituent encoder 218 of FIG. 5.

Next, constituent permutations $\pi_{AB}$, $\pi_{AC}$, $\pi_{BC}$ are constructed for each of the sets of shared information bits 608, 610 and 612 by respective interleavers 614, 616 and 618, whereby forming interleaved sets of shared information bits 620, 622 and 624 (Step 706 of FIG. 7). For example, as illustrated, interleavers 614, 616 and 618 produce $v_{AB}(t)$, $v_{BC}(t)$ and $v_{AC}(t)$, respectively, where $v_x(t)=u_x(\pi_x(t))$. These permutations $\pi_{AB}$, $\pi_{AC}$, $\pi_{BC}$ are constructed according to any good rule for conventional turbo code interleaver design, e.g. Interleavers 614, 616 and 618 are all s-random interleavers with spreading parameters $s^{AB}$, $s_{AC}$, $s_{BC}$, respectively.

Next, respective ones of the sets of interleaved information bits $v_{AB}(t)$, $v_{BC}(t)$ and $v_{AC}(t)$ are interlaced to form sets of interlaced interleaved information bits (Step 708 of FIG. 7). For example, the interleaver for constituent encoder B 220, e.g. interleaved data substream $v_B(t)$, is constructed as an interlacing of $\pi_{AB}$ acting on the AB bits (i.e. $\underline{u}_{AB}$) and the identity permutation acting on the BC bits; while the interleaver for constituent encoder C 222, e.g. interleaved data substream $v_C(t)$, is constructed as an interlacing of $\pi_{AC}$ acting on the AC bits (i.e. $\underline{u}_{AC}$) and $\pi_{BC}$ acting on the BC bits (i.e. $\underline{u}_{BC}$). The interlacing is performed by an interlacer, e.g. interlacers 626 and 628, which perform the function of interlacing bits from two data streams. For example, given two data streams A=[bit 1, bit 2, bit] and B=[bit 1, bit 2, bit 3], then the interlacer will form one output data stream X=[bit 1 from stream A, bit 1 of stream B. bit 2 of stream A, bit 2 of stream B, bit 3 of stream A, bit 3 of stream B]. This function can easily be performed in software by an appropriately programmed digital signal processor, for example. The interlacer functionality is easily implementable by the skilled artist.

Specifically, consistent with the example above, the P2CCC encoder 502 interleavers are given by Equations (1):

$$\lambda_{C|B}(t) = \sum_{j=0}^{t-1} i_{C|B}(j)$$

while $\pi_A(t)$ is the identity permutation.

Since the constituent permutations $\pi_{AB}$, $\pi_{AC}$, $\pi_{BC}$ in this construction are S-random interleavers, i.e. interleavers 614, 616 and 618, with spreading parameters $s_{AB}$, $s_{AC}$, $s_{BC}$, respectively, the interlacing strategy ensures that good spreading is preserved among the bits shared by any pair of constituent encoders 218, 220 and 222. In particular, $\pi_B$ achieves spreading factor $s_{AB}$ for the AB bits; while $\pi_C$ achieves spreading factor $s_{AC}$ for the AC bits and spreading factor $s_{BC}$ for the BC bits. Thus, advantageously, a minimum separation (i.e. $s_{AB}$, $s_{AC}$ and $s_{BC}$) is maintained. In contrast, the interleaver design of FIG. 1 incorporating uncoordinated s-random interleavers discussed earlier provides no guaranteed spreading for the BC bits, leading to the poor performance of the P2CCC encoder in the asymptotic region (see FIG. 4).

Example I

The following is a numerical example illustrating this embodiment more concretely. Let the input data stream 202 in natural order be u(0),u(1), . . . ,u(11) and assume the simple modulo 3 parser 204. Thus, the parsed data substreams 206, 208 and 210 are respectively:

$\underline{u}_A=[u(0),u(1),u(3),u(4),u(6),u(7),u(9),u(10)]$ $\underline{u}_B=[u(1),u(2),u(4),u(5),u(7),u(8),u(10),u(11)]$ $\underline{u}_C=[u(0),u(2),u(3),u(5),u(6),u(8),u(9),u(11)]$, and the sets of shared information bits 612, 608 and 610 are respectively:

$\underline{u}_{AC}=[u(0),u(3),u(6),u(9)]$ $\underline{u}_{AB}=[u(1),u(4),u(7),u(10)]$ $\underline{u}_{BC}=[u(2),u(5),u(8),u(11)]$.

As can be seen, each of the sets of shared information bits 608, 610 and 612, formed by respective ones of the bit selectors 602, 604 and 606, contain information bits in common to the respective pairs of parsed data streams 206, 208 and 210. Interleaver A 212, i.e. the identity permutation, produces the interleaved data substream 504:

$\underline{v}_A=[u(0),u(1),u(3),u(4),u(6),u(7),u(9),u(10)]$ which is the input to constituent encoder A 218.

Assume that the following permutations are designed at the respective ones of s-random interleavers 614, 616 and 618:

Bit-reversal indexing (interleaver 618):

$\pi_{AC}(0)=0,\pi_{AC}(1)=2,\pi_{AC}(2)=1,\pi_{AC}(3)=3$;

Time-reversal (interleaver 614):

$\pi_{AB}(0)=3,\pi_{AB}(1)=2,\pi_{AB}(2)=1,\pi_{AB}(3)=0$;

Left-shift (interleaver 610):

$\pi_{BC}(0)=1,\pi_{BC}(1)=2,\pi_{BC}(2)=3,\pi_{BC}(3)=0$.

Then, the constituent interleavers 614, 616 and 618 produce the interleaved data substreams 506 and 508, respectively:

$\underline{v}_B=[u(10),u(2),u(7),u(5),u(4),u(8),u(1),u(11)]$ $\underline{v}_C=[u(0),u(5),u(6),u(8),u(3),u(11),u(9),u(2)]$.

Note that $\underline{v}_B$ is produced by interlacer 626, which is an interlacing of $\underline{u}_{AB}$ and $v_{AB}$, and $\underline{v}_C$ is produced by interlacer 628, which is an interlacing of $v_{BC}$ and $v_{AC}$.

These results are in agreement with the permutations $\pi_B$ and $\pi_C$ computed in FIG. 8 from the Equations (1). FIG. 8 is a table of the computational P2CCC interleavers to be input into the respective constituent encoders of the P2CCC encoder 502 of FIG. 5 following Example I. Note that $\pi_A$ is not shown since this is the identity permutation.

Note also that, in this design example, the interlacing used to construct $\pi_B$ and $\pi_C$ put the information bits shared with encoder A in even-indexed rather than odd-indexed positions. This of course was an arbitrary choice that could have been different in either or both instances without significantly changing the design. Other interlacings would also be possible. Further note that the information bits (i.e. $v_A(t)$) input to constituent encoder A 218 nor the BC bits (i.e. $u_{BC}(t)$) input to constituent encoder B 220 were not permuted from their natural order. Next, an example of a general P2CCC interleaver design procedure readily accommodates interleavers in which these bits are also permuted or interleaved.

EXAMPLE II

In this example, a generic example of a P2CCC coordinated interleaver design in which all of the information bits to be input into the respective constituent encoders 218, 220 and 222 are permuted from their natural order, in contrast to the Example I in which the information bits (i.e. $v_A(t)$) input to constituent encoder A 218 and the BC bits (i.e. $u_{BC}(t)$) input to constituent encoder B 220 were not permuted from their natural order.

To demonstrate this general case, the input data stream 202 to the P2CCC encoder 500 is first permuted by a global permutation $\sigma$ of a special type before being parsed by the parser 204 to the constituent encoders 218, 220 and 222. In this case, the input data stream 102 to the parser 104 is given by:

$$\pi_B(t) = \begin{cases} 2\pi_{AB}(\lambda_{A|B}(t)), & \text{if } i_{A|B}(t) = 1; \\ 2\lambda_{C|B}(t) + 1, & \text{otherwise;} \end{cases} \quad (1)$$

$$\pi_C(t) = \begin{cases} 2\pi_{AC}(\lambda_{A|C}(t)), & \text{if } i_{A|C}(t) = 1; \\ 2\pi_{BC}(\lambda_{B|C}(t)) + 1, & \text{otherwise;} \end{cases}$$

A permutation $\sigma$ will be said to be pliant with respect to the parsing if the pair $u(t)$ and $u(\sigma(t))$ are always parsed to the same constituent encoder. For a pliant permutation $\sigma$, the ordered parsings seen by the constituent encoders may be different, but the unordered parsings are the same, i.e. the same data bits are processed by the same constituent encoders. This implies that the two chains $\sigma \to \sigma_B \to \sigma_{A|B}$ and $\sigma \to \sigma_A \to \sigma_{B|A}$ of induced permutations result in a common terminal permutation $\sigma_{AB} = \sigma_{A|B} = \sigma_{B|A}$. Thus, the ordered vectors $\underline{u}_A^{(\sigma)}$, $\underline{u}_{AB}^{(\sigma)}$, etc. are all well-defined and; therefore, the proposed P2CCC interleaver design procedure of FIGS. 5 and 6 can be directly applied to the relabeled input data stream $\underline{u}^{(\sigma)}$.

Using ($\sigma$)-superscripts to denote functions that are defined with respect to the relabeled input data stream, the P2CCC interleaver designs for constituent encoders B 220 and C 222 are given by the Equations (2):

$$\pi_B^{(\sigma)}(t) = \begin{cases} 2\pi_{AB}^{(\sigma)}(\lambda_{A|B}^{(\sigma)}(t)), & \text{if } i_{A|B}^{(\sigma)}(t) = 1; \\ 2\lambda_{C|B}^{(\sigma)}(t) + 1, & \text{otherwise;} \end{cases} \quad (2)$$

$$\pi_C^{(\sigma)}(t) = \begin{cases} 2\pi_{AC}^{(\sigma)}(\lambda_{A|C}^{(\sigma)}(t)), & \text{if } i_{A|C}^{(\sigma)}(t) = 1; \\ 2\pi_{BC}^{(\sigma)}(\lambda_{B|C}^{(\sigma)}(t)) + 1, & \text{otherwise;} \end{cases}$$

In order to give the general P2CCC interleaver designs with respect to the original order of information bits, we simply absorb the global $\sigma$ permutation into the constituent permutations by defining $\pi_A \sigma_A$, $= \pi_B = \sigma_B \, ^o\pi_B^{(\sigma)}$, and $\pi_C = \sigma_C \, ^o\pi_C^{(\sigma)}$, which may also be expressed by the following set of Equations (3):

$$\pi_B(t) = \begin{cases} 2\pi_{AB}(\lambda_{A|B}(t)), & \text{if } i_{A|B}(t) = 1; \\ 2\sigma_{BC}(\lambda_{C|B}(t)) + 1, & \text{otherwise;} \end{cases} \quad (3)$$

$$\pi_C(t) = \begin{cases} 2\pi_{AC}(\lambda_{A|C}(t)), & \text{if } i_{A|C}(t) = 1; \\ 2\pi_{BC}(\lambda_{B|C}(t)) + 1, & \text{otherwise;} \end{cases}$$

where $\pi_{AB} = \sigma_{AB} \, ^o\pi_{AB}^{(\sigma)}$, $\pi_{AC} = \sigma_{AC} \, ^o\pi_{AC}^{(\sigma)}$, and $\pi_{BC} = \sigma_{BC} \, ^o\pi_{BC}$.

The equivalence of the two formulations in Equations (2) and Equations (3) is readily derived from the observation that $\sigma$ is pliant and that this implies We extend the previous numerical example to encompass the more general case. Consider the permutation that maps $\underline{u}$ to $$\underline{u}^{(\sigma)} = [u(0), u(4), u(8), u(9), u(1), u(5), u(6), u(10), u(2), u(3), u(7), u(11)].$$

Briefly referring to FIG. 9, a table is shown of the parsed data substreams 106, 108 and 110 (i.e. $\sigma_A$, $\sigma_B$ and $\sigma_C$) and the sets of shared information bits 508, 510 and 512 (i.e. $\sigma_{AB}$, $\sigma_{BC}$ and $\sigma_{AC}$) as generated from the coordinated interleaver design of FIGS. 5 and 6 in accordance with Example II resulting from the input data stream $\underline{u}^{(\sigma)}$ given above.

Applying the interleaver designs from the earlier numerical example, i.e. interleaver 618 is bit-reversal indexing, interleaver 614 is time reversal, and interleaver 616 is left-shift, the following interleaved sequences 504, 506 and 508, having been interlaced consistent with the strategy of FIG. 6, at the input to the constituent encoders 218, 220 and 222:

$$u^{(\sigma)} = [u^{(\sigma)}(0), u^{(\sigma)}(1), \ldots, u^{(\sigma)}(3n-1)]$$
$$= [u(\sigma(0)), u(\sigma(1)), \ldots, u(\sigma(3n-1))].$$

These results are in agreement with the permutations $\pi_A$, $\pi_B$ and $\pi_C$ computed in FIG. 10 from the Equations (3). FIG. 10 is a table of the computational P2CCC interleavers to be input into the respective constituent encoders of the P2CCC encoder 502 of FIGS. 5 and 6 following Example II. Note that $\pi_A$ is shown as equal to the global permutation $\sigma_A(t)$ since interleaver 212 is the identity permutation.

Referring next to FIG. 7, a flow chart is shown of the steps performed by the parsed parallel concatenated code (P2CCC) encoder of FIGS. 5 and 6 using the coordinated interleaver design of FIG. 6 in accordance with one embodiment. These steps are performed in software by a processor, for example, a digital signal processor, encompassing an encoder in the transmission path of a communications channel, for example, P2CCC encoder 108 of FIG. 1.

In operation, the inputs to the coordinated interleaver design are the three parsed data substreams 206, 208 and 210. Thus, the first step in the P2CCC encoder is to parse the input data stream in to a plurality of parsed data substreams according to a parsing scheme (Step 702 of FIG. 7). For example, input data stream 202 is parsed into parsed data substreams 206, 208 and 210. Next, sets of shared information bits are formed between respective pairs of the parsed data substreams 206, 208 and 210, wherein each of the sets of shared information bits includes the information bits in common between the respective pairs of parsed data substreams (Step 704 of FIG. 7). For example, $u_{AB}(t)$, $u_{BC}(t)$ and $u_{AC}(t)$ are formed by the bit selectors 602, 604 and 606.

Next, constituent permutations are constructed for each of the sets of shared information bits 608, 610 and 612 by respective interleavers 614, 616 and 618, whereby forming interleaved sets of shared information bits 620, 622 and 624 (Step 706 of FIG. 7). Then, respective ones of the sets of interleaved information bits $v_{AB}(t)$, $v_{BC}(t)$ and $v_{AC}(t)$ are interlaced to form sets of interlaced interleaved information bits or interleaved data substreams (Step 708 of FIG. 7). For example, as shown in Example I, $v_{BC}(t)$ and $v_{AC}(t)$ are interlaced at interlacer 628 to form $v_C(t)$, which is the set of information bits to be input into constituent encoder C 222. Likewise, in Example I, $v_{AB}(t)$ and $u_{BC}(t)$ are interlaced at interlacer 626 to form the set of information bits (i.e. $v_B(t)$) to be input to constituent encoder B 220. Additionally, note that the identity permutation is performed on the parsed data substream 206 (at interleaver 212) to form the set of information bits (i.e. $v_A(t)$) to be input to constituent encoder A 218.

Next, each of the interleaved data substreams are encoded by a respective constituent encoder according to the P2CCC coding techniques known in the art (Step 710 of FIG. 7). For example, sets of interleaved data substreams 506 and 508 are encoded at the constituent encoders 220 and 222, respectively, producing parity bit streams 226 and 228, respectively. Likewise, interleaved data substream 504 is encoded by constituent encoder 218, producing parity bit stream 224. And finally, each of the parity bit streams 224, 226 and 228 are punctured to produce the encoded output data stream 232 (Step 712 of FIG. 7).

It is noted that an appropriate decoder may be designed based on the same principles as the conventional turbo codes with modifications according to the coordinated interleaver designs as described above.

While the invention herein disclosed has been described by means of specific embodiments and applications thereof, numerous modifications and variations could be made thereto by those skilled in the art without departing from the scope of the invention set forth in the claims.

What is claimed is:

1. A method of interleaving an input data stream for parsed parallel concatenated code encoding comprising:
    parsing the input data stream into a plurality of parsed data substreams; and
    forming sets of shared information bits, wherein each of the sets of shared information bits comprises information bits in common with respective pairs of the plurality of parsed data substreams.

2. The method of claim 1 further comprising constructing constituent permutations of one or more of the sets of shared information bits.

3. The method of claim 2 wherein the constructing step comprises constructing the constituent permutations of the one or more of the sets of shared information bits using s-random interleavers.

4. The method of claim 2 further comprising constructing a constituent permutation of one of the plurality of parsed substreams.

5. The method of claim 2 further comprising constructing a constituent permutation of one of the plurality of parsed substreams using an identity permutation.

6. The method of claim 2 further comprising interlacing respective pairs of the sets of shared information bits to form respective interleaved data substreams, wherein at least one set of shared information bits of each respective pair of sets of shared information bits has undergone the constructing step.

7. The method of claim 6 wherein the forming, constructing, and interlacing steps are performed to provide a desired minimum separation between information bits common between respective pairs of the interleaved data substreams.

8. The method of claim 6 further comprising encoding the respective interleaved data substreams using parsed parallel concatenated codes to produce respective parity bit streams.

9. The method of claim 8 further comprising puncturing at least the respective parity bits streams to produce an encoded output data stream.

10. The method of claim 1 further comprising splitting, prior to the forming step, each of the plurality of the-parsed data substreams into two or more respective copies of each of the plurality of parsed data substreams.

11. An interleaver design for a parsed parallel concatenated code encoder comprising:
    a parser for parsing an input data stream into a plurality of parsed data substreams; and
    a plurality of interleavers coupled to the parser such that each of the plurality of interleavers constructs constituent permutations of respective ones of sets of shared information bits, wherein each of the sets of shared information bits comprises information bits in common to respective pairs of the plurality of parsed data substreams.

12. The interleaver design of claim 11 further comprising one or more interlacers each coupled to one or more of the plurality of interleavers, wherein the interlacer interlaces respective pairs of the sets of shared information bits to form interleaved data substreams, wherein at least one set of shared information bits of each respective pair of sets of shared information bits has passed through a respective one of the plurality of interleavers.

13. The interleaver design of claim 12 further comprising a constituent encoder coupled to each of the one or more interlacers, wherein the constituent encoder encodes the respective interleaved data substream using parsed parallel concatenated code encoding to form a respective parity bit stream.

14. The interleaver design of claim 11 wherein said each of the plurality of interleavers comprises an s-random interleaver.

15. The interleaver design of claim 11 further comprising another interleaver coupled to the parser for interleaving a respective one of the plurality of parsed data substreams.

16. The interleaver design of claim 11 further comprising a plurality of bit selectors, wherein each of the plurality of bit selectors couples the parser to a respective one of the plurality of interleavers, wherein the plurality of bit selectors form sets of shared information bits, wherein each of the sets of shared information bits comprises information bits in common with respective pairs of the plurality of parsed data substreams.

* * * * *